(12) United States Patent
Lai et al.

(10) Patent No.: US 8,246,200 B2
(45) Date of Patent: Aug. 21, 2012

(54) ILLUMINATION DEVICE

(75) Inventors: Chih-Ming Lai, Miao-Li Hsien (TW);
Tien-Pao Chen, Miao-Li Hsien (TW);
Chiao-Ling Peng, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 210 days.

(21) Appl. No.: 12/840,301

(22) Filed: Jul. 21, 2010

(65) Prior Publication Data

US 2011/0057579 A1 Mar. 10, 2011

(30) Foreign Application Priority Data

Sep. 9, 2009 (CN) .......................... 2009 1 0306806

(51) Int. Cl.
*F21V 1/00* (2006.01)
*H05B 37/02* (2006.01)

(52) U.S. Cl. ........ 362/235; 362/268; 362/331; 362/330; 362/336; 362/335; 362/311.01; 362/231; 315/192; 315/294

(58) Field of Classification Search .......... 362/326–341, 362/606, 607, 311.01, 311.02, 311.06, 311.09, 362/247; 315/192, 294
See application file for complete search history.

(56) References Cited

U.S. PATENT DOCUMENTS

| | | | | |
|---|---|---|---|---|
| 6,250,777 B1 * | 6/2001 | Aoyama | ...................... | 362/326 |
| 7,360,924 B2 * | 4/2008 | Henson et al. | ................ | 362/241 |
| 7,658,526 B2 * | 2/2010 | Henson et al. | ................ | 362/554 |
| 7,753,564 B2 * | 7/2010 | Cheng et al. | ............ | 362/311.06 |
| 7,963,666 B2 | 6/2011 | Leung et al. | | |
| 7,988,328 B2 * | 8/2011 | Cheng et al. | .................. | 362/237 |
| 7,988,334 B2 | 8/2011 | Cheng et al. | | |
| 8,016,459 B2 * | 9/2011 | Cheng et al. | ............ | 362/311.02 |
| 2007/0064421 A1 * | 3/2007 | Baba | ............................. | 362/231 |
| 2008/0084694 A1 | 4/2008 | Rose et al. | | |
| 2011/0044022 A1 * | 2/2011 | Ko et al. | ......................... | 362/84 |
| 2012/0068615 A1 * | 3/2012 | Duong et al. | ................. | 315/192 |

FOREIGN PATENT DOCUMENTS

| | | |
|---|---|---|
| CN | 2539377 Y | 3/2003 |
| CN | 101297238 A | 10/2008 |
| CN | 101514803 A | 8/2009 |
| TW | 200805717 A | 1/2008 |
| TW | 200817636 A | 4/2008 |
| TW | 200917900 A | 4/2009 |
| WO | 2007/049176 A1 | 5/2007 |

* cited by examiner

*Primary Examiner* — Vibol Tan
(74) *Attorney, Agent, or Firm* — Altis Law Group, Inc.

(57) ABSTRACT

An illumination device includes a light source module consisting of a substrate and a plurality of light emitting elements on the substrate in an array and an optical module array consisting of a plurality of optical modules covering the light emitting elements. Each optical module includes a first optical component and a second optical component. A first illumination distribution pattern is generated by light from the light emitting elements and modulated by the first optical components. A second illumination distribution pattern is generated by light from the light emitting elements and modulated by the second optical components. An illumination distribution pattern of the illumination device is superposition of the first illumination distribution pattern and the second illumination distribution pattern.

11 Claims, 19 Drawing Sheets

ILLUMINATION DEVICE

BACKGROUND

1. Technical Field

The disclosure relates generally to illumination, and more particularly to an illumination device utilizing multiple optical modules.

2. Description of the Related Art

With the development of LED-based illumination, effective distribution of light from LEDs is a major priority. Normally, an illumination device has only one illumination distribution pattern, with others unavailable. Thus, what is called for is an illumination device with multiple illumination distribution patterns that can overcome the limitations described.

DETAILED DESCRIPTION

Figure 1:
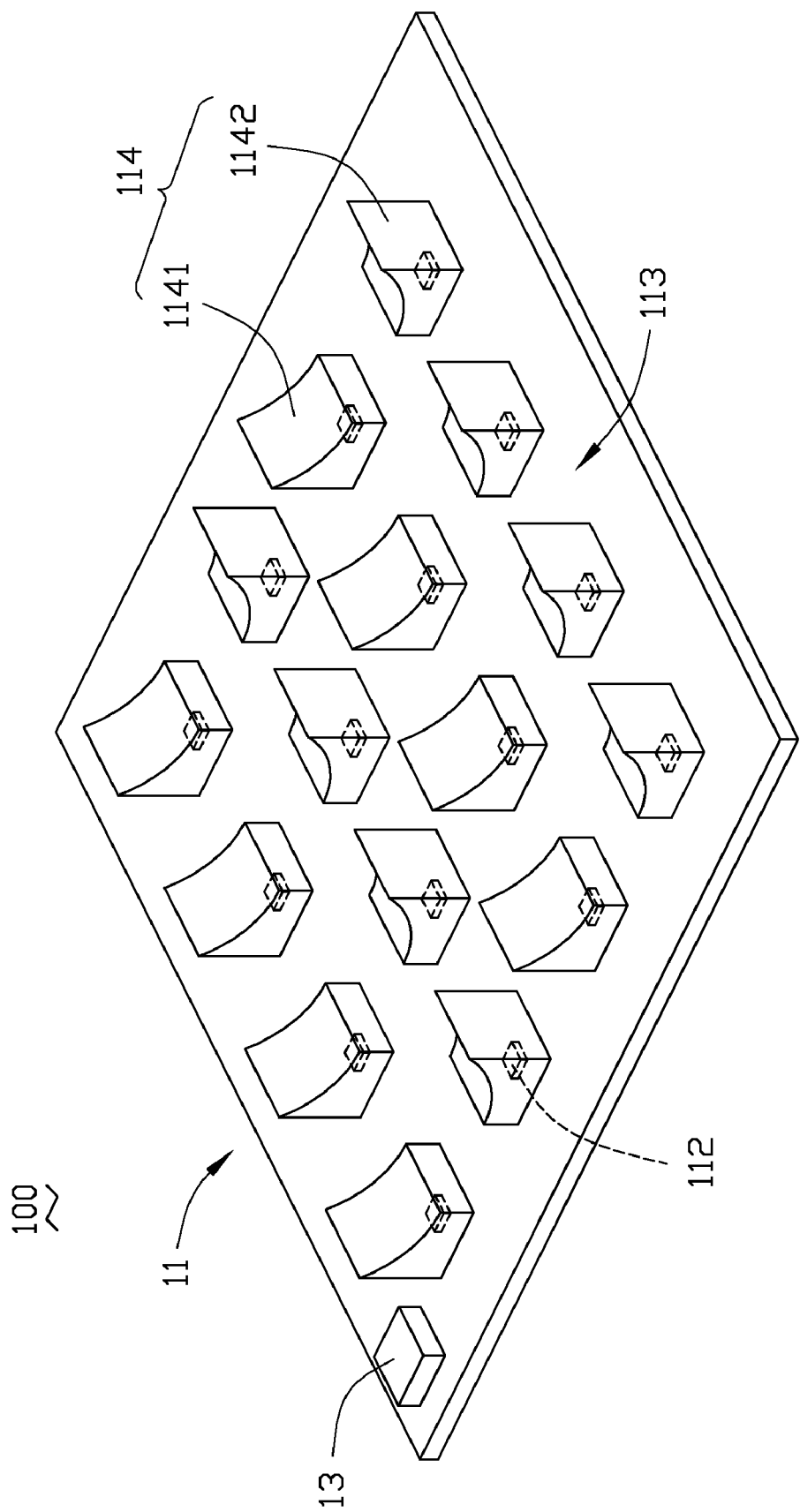
FIG. 1 is an isometric view of an illumination device in accordance with a first embodiment of the disclosure.
Figure 2:
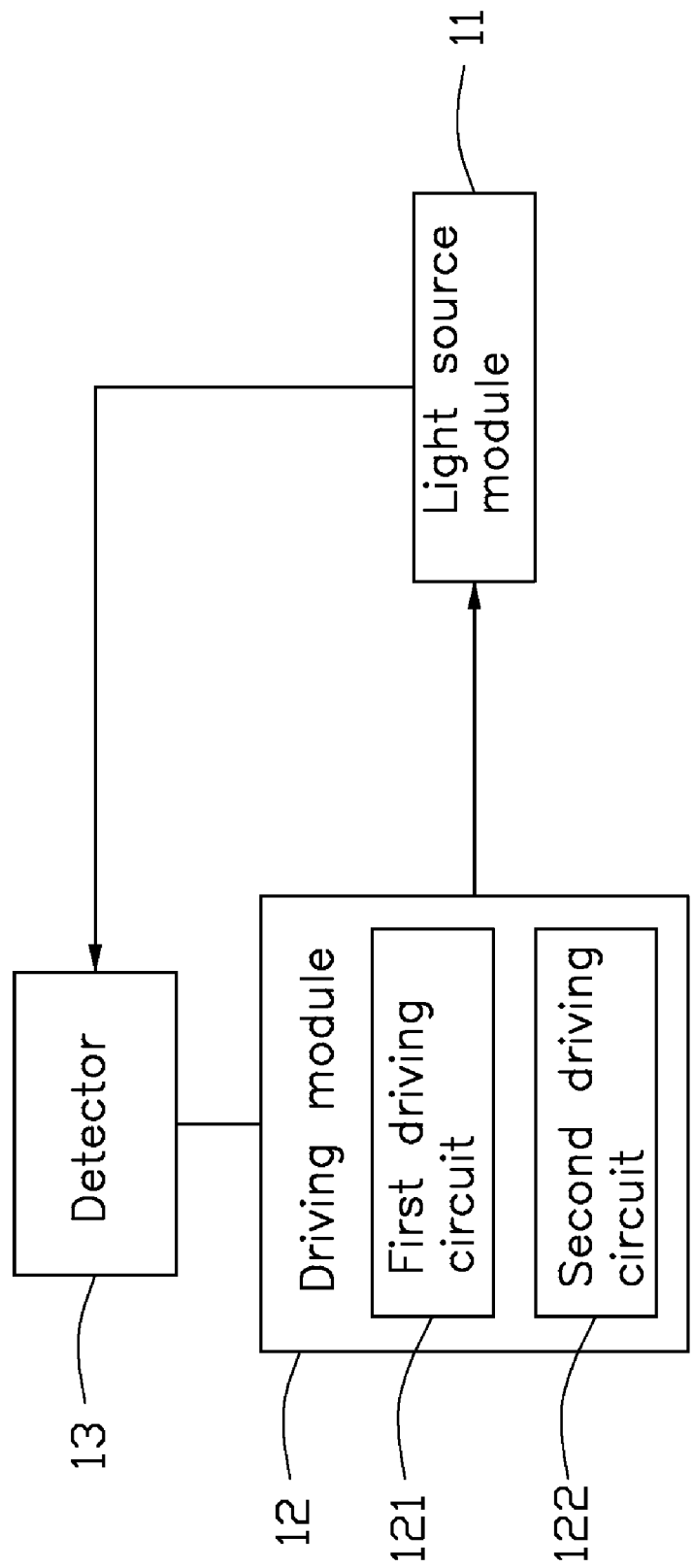
FIG. 2 is a block diagram of the illumination device in FIG. 1.
Figure 3:
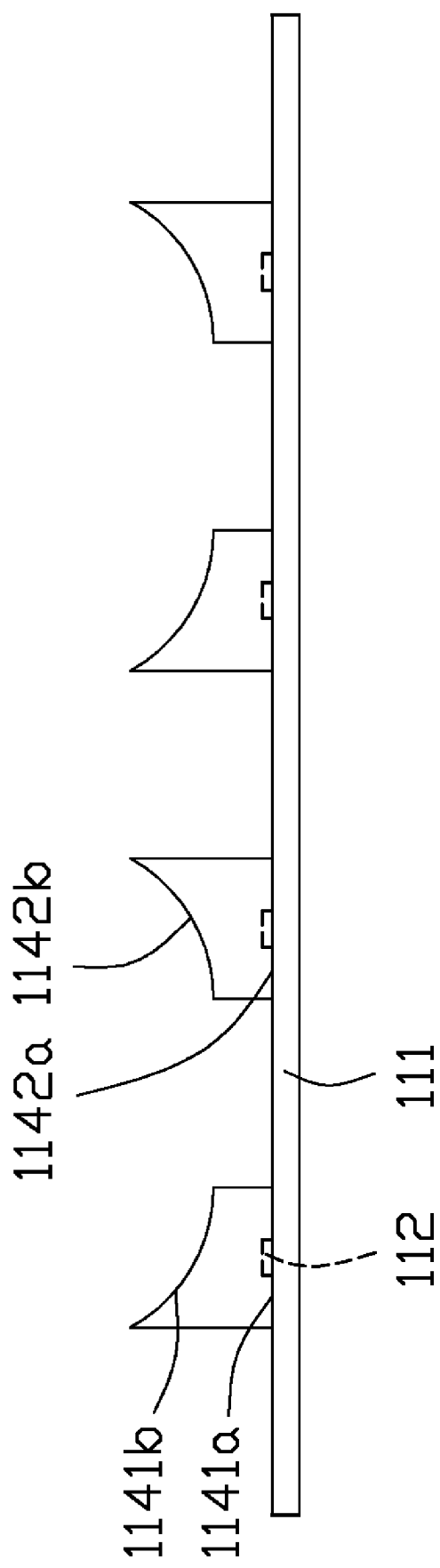
FIG. 3 is a cross section of the illumination device in FIG. 1.

Referring to FIGS. 1-6, an illumination device 100 includes a light source module 11, a driving module 12 and a detector 13.

The light source module 11 includes a substrate 111, a plurality of light emitting elements 112 and an optical module 113. The light emitting elements 112 are light emitting diodes and configured to be electrically connected to the substrate 111. The optical module 113 includes a plurality of optical component modules 114, each including a first lens 1141 and a second lens 1142.

The first lens 1141 includes a first surface 1141a and a second surface 1141b. The first surface 1141a is a light incident surface. The second surface 1141b is concave. The second surface 1141b extends downwardly along a rightward direction of FIG. 3. The second lens 1142 includes a first surface 1142a and a second surface 1142b. The first surface 1142a is a light incident surface. The second surface 1142b is concave. The second surface 1142b extends upwardly along the rightward direction of FIG. 3. The second surface 1141b and the second surface 1142b are arranged symmetrically. The first lenses 1141 and the second lenses 1142 are interleavedly arranged on the substrate 111. In other words, a row formed by the first lenses 1141 neighbors a row formed by the second lenses 1142, and vice versa.

The detector 13 is a light intensity detector. The detector 13 is mounted on the substrate 111 to detect the intensity of environmental illumination. The detector 13 is configured for providing an intensity signal of environmental illumination to the driving module 12.

The driving module 12 includes a first driving circuit 121 and a second driving circuit 122. The first driving circuit 121 is configured for controlling currents through the light emitting elements 112 corresponding to the first lenses 1141 and the intensity thereof according to the intensity signal from detector 13. The second driving circuit 122 is configured for controlling currents through the light emitting elements 112 corresponding to the second lenses 1142 and the intensity thereof according to the intensity signal from detector 13.

Figure 4:
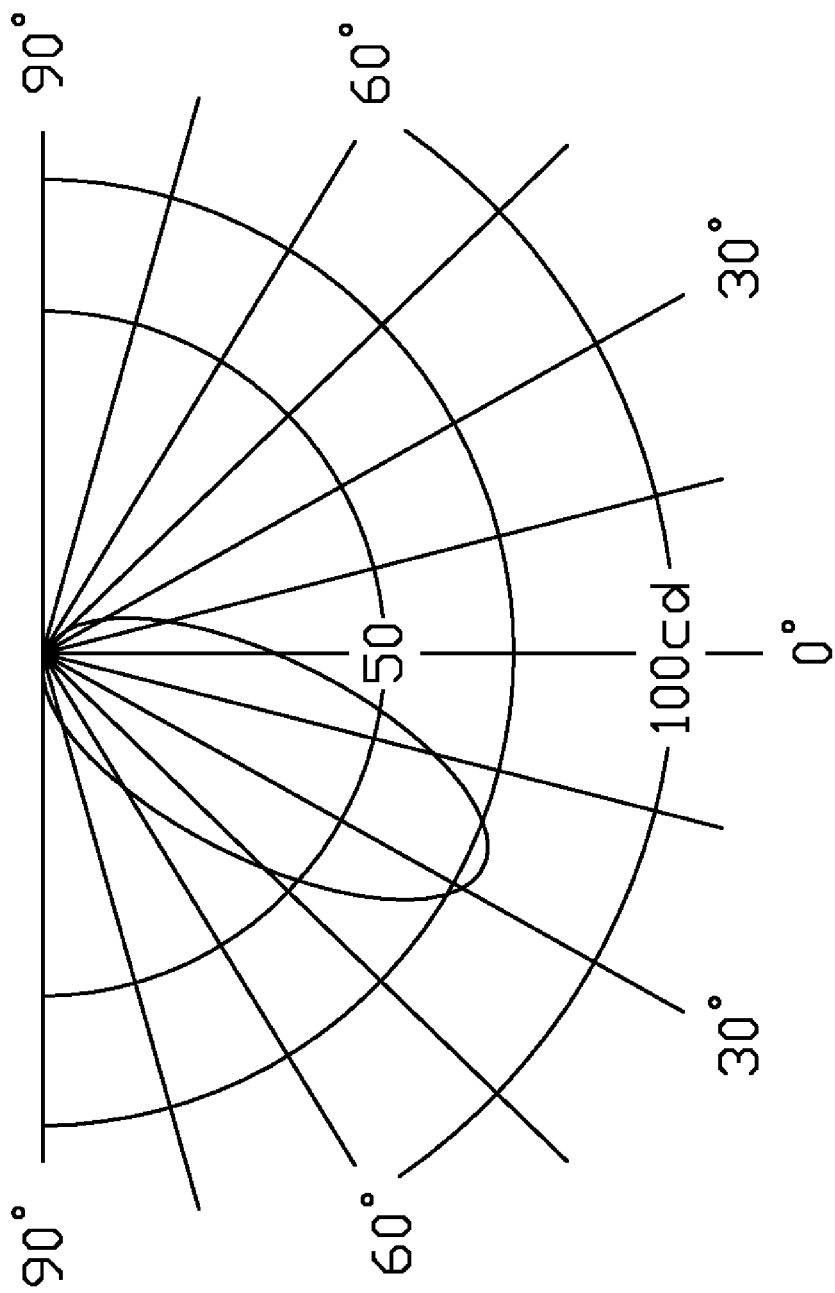
FIG. 4 is an illumination distribution pattern map generated by light through first lenses of the illumination device in FIG. 1.
Figure 5:
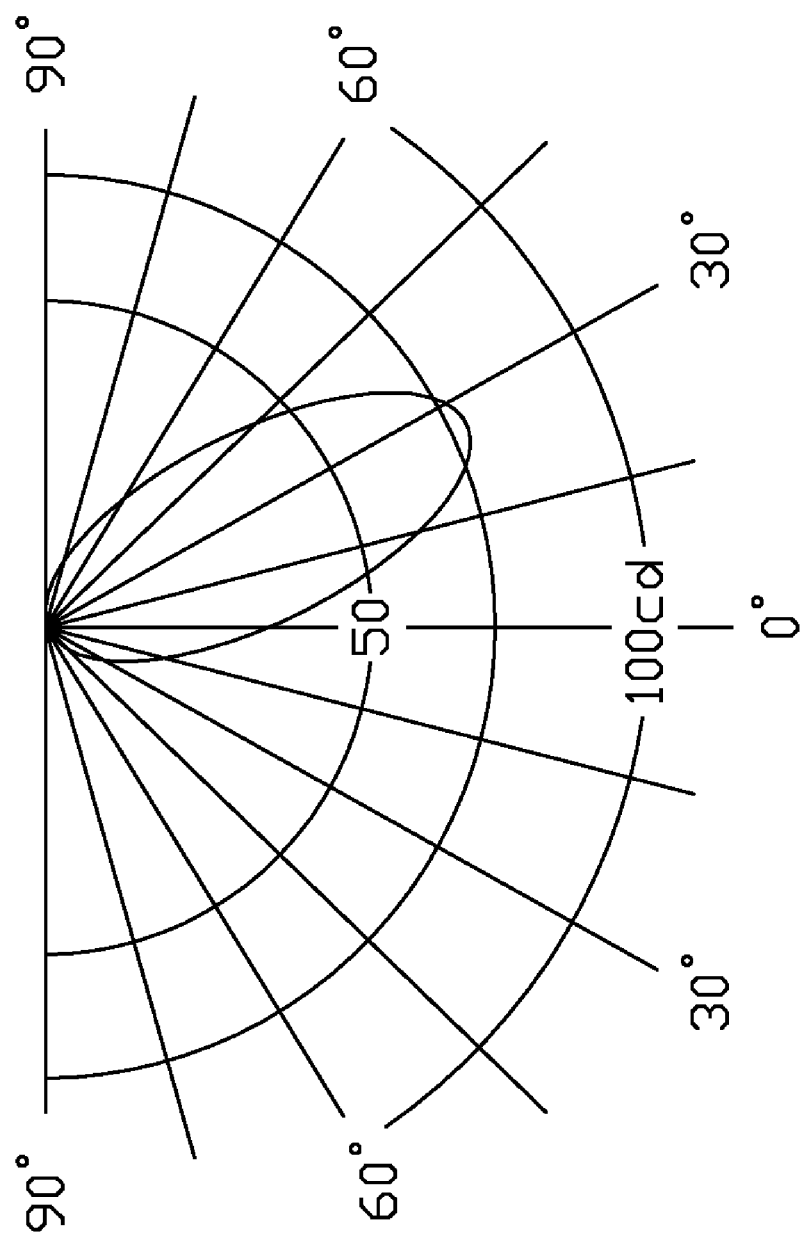
FIG. 5 is an illumination distribution pattern map generated by light through second lenses of the illumination device in FIG. 1.
Figure 6:
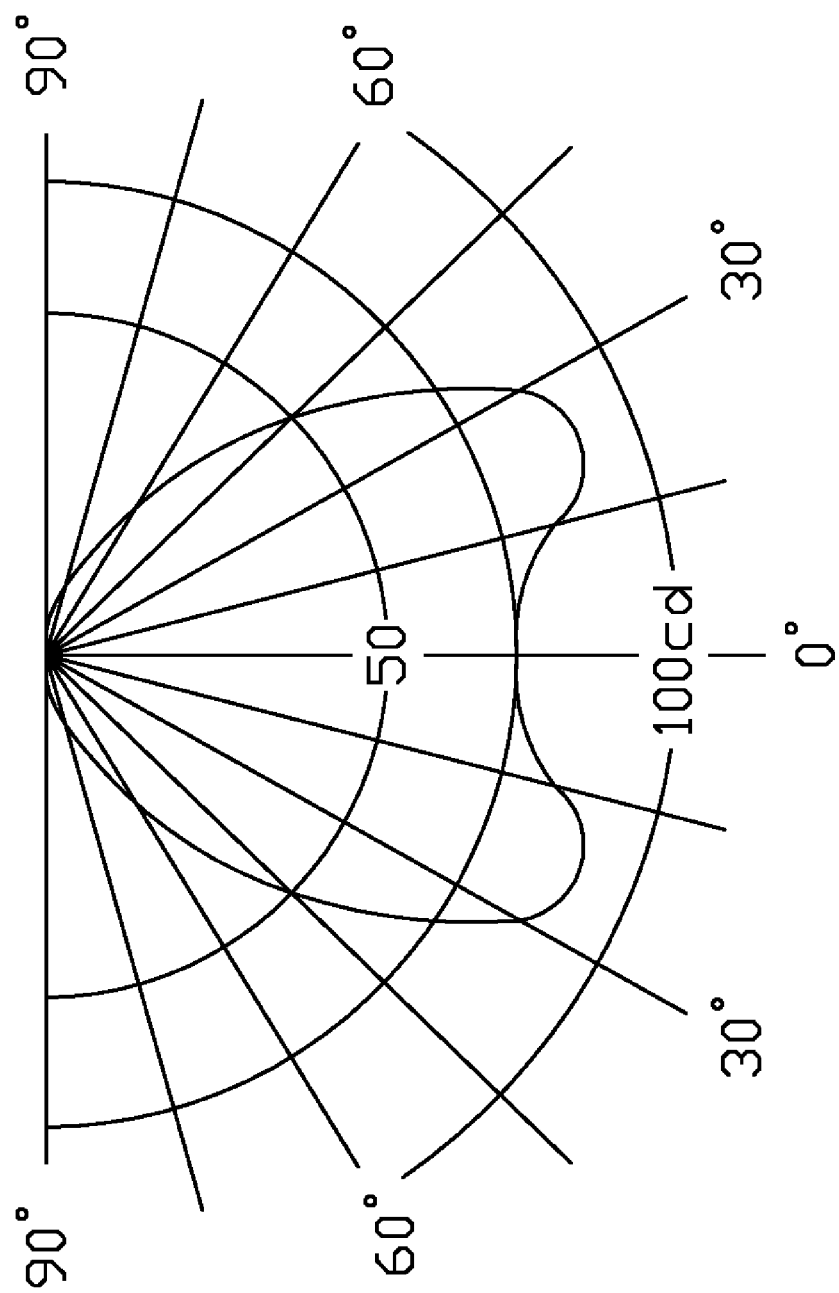
FIG. 6 is an illumination distribution pattern map generated by light through first lenses and second lenses of the illumination device in FIG. 1.
Figure 7:
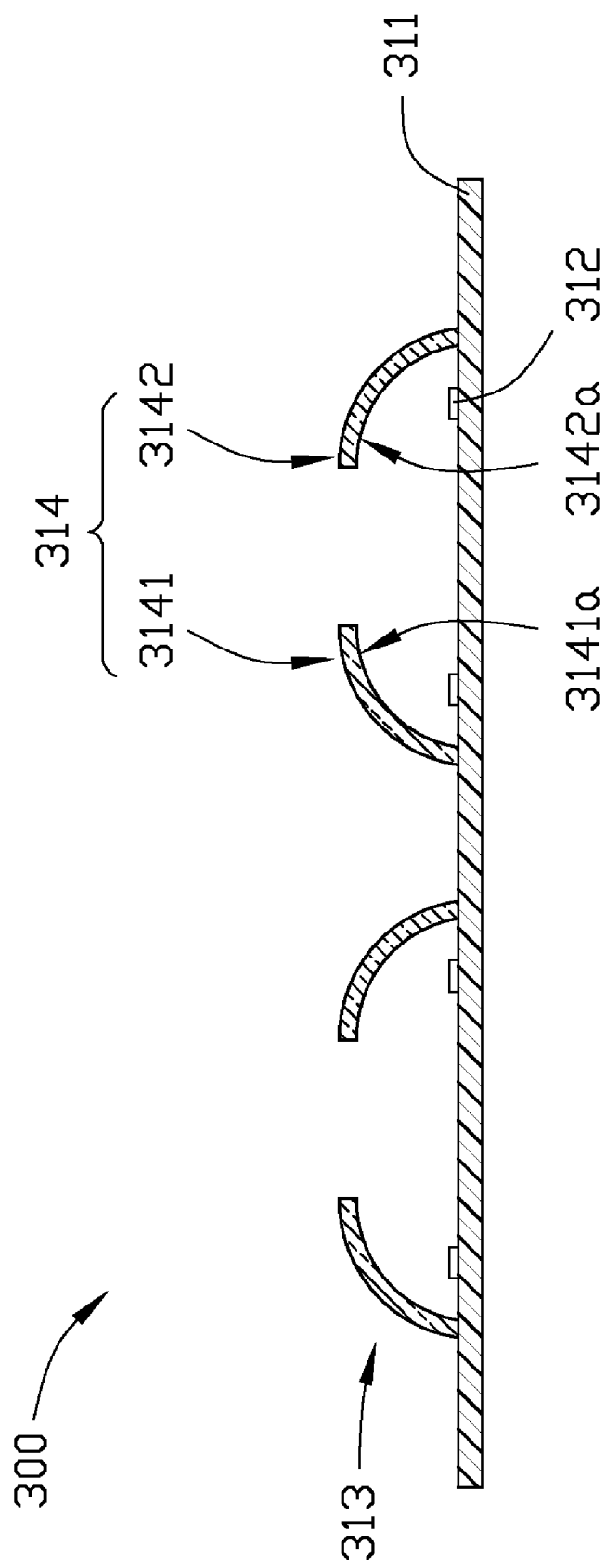
FIG. 7 is a cross-section of an illumination device in accordance with a second embodiment of the disclosure.

FIG. 4 shows the illumination distribution pattern of light through first lenses 1141 achieving a predetermined intensity. FIG. 5 shows the illumination distribution pattern of light through second lenses 1142 achieving a predetermined intensity. FIG. 6 is a superposition of the illumination distribution patterns through the first lenses 1141 and the second lenses 1142.

Multiple predetermined illumination distribution patterns can be easily obtained by adjusting the illumination distribution pattern through lenses 1141 and the illumination distribution pattern through lenses 1142.

Referring to FIGS. 7-10, an illumination device 300 in accordance with a second embodiment of the disclosure differs from the illumination device 100 only in an optical module 313 thereof. The optical module 313 of the second embodiment includes a plurality of reflective plate modules 314, arrayed and each including a first reflective plate 3141 and a second reflective plate 3142.

The first reflective plate 3141 includes an inner surface 3141a configured for reflecting light generated by a corresponding light emitting element 312 mounted on a substrate 311 and covered by the first reflective plate 3141. The second reflective plate 3142 includes an inner surface 3142a configured for reflecting light generated by a corresponding light emitting element 312 covered by the second reflective plate 3142. The inner surface 3141a and the inner surface 3142a face downwardly toward the light emitting elements 312 and are concave in the shown embodiment. Alternatively they can be planar. The first reflective plate 3141 and the second reflective plate 3142 are arranged symmetrically. The inner surface 3141a of the first reflective plate 3141 extends upwardly along a rightward direction of FIG. 7, while the inner surface 3142a of the second reflective plate 3142 extends downwardly along the rightward direction. A gap is exited between the first and second reflective plates 3141, 3142 through which light reflected by the first and second reflective plates 3141, 3142 radiate upwardly to illuminate an intended object.

Figure 8:
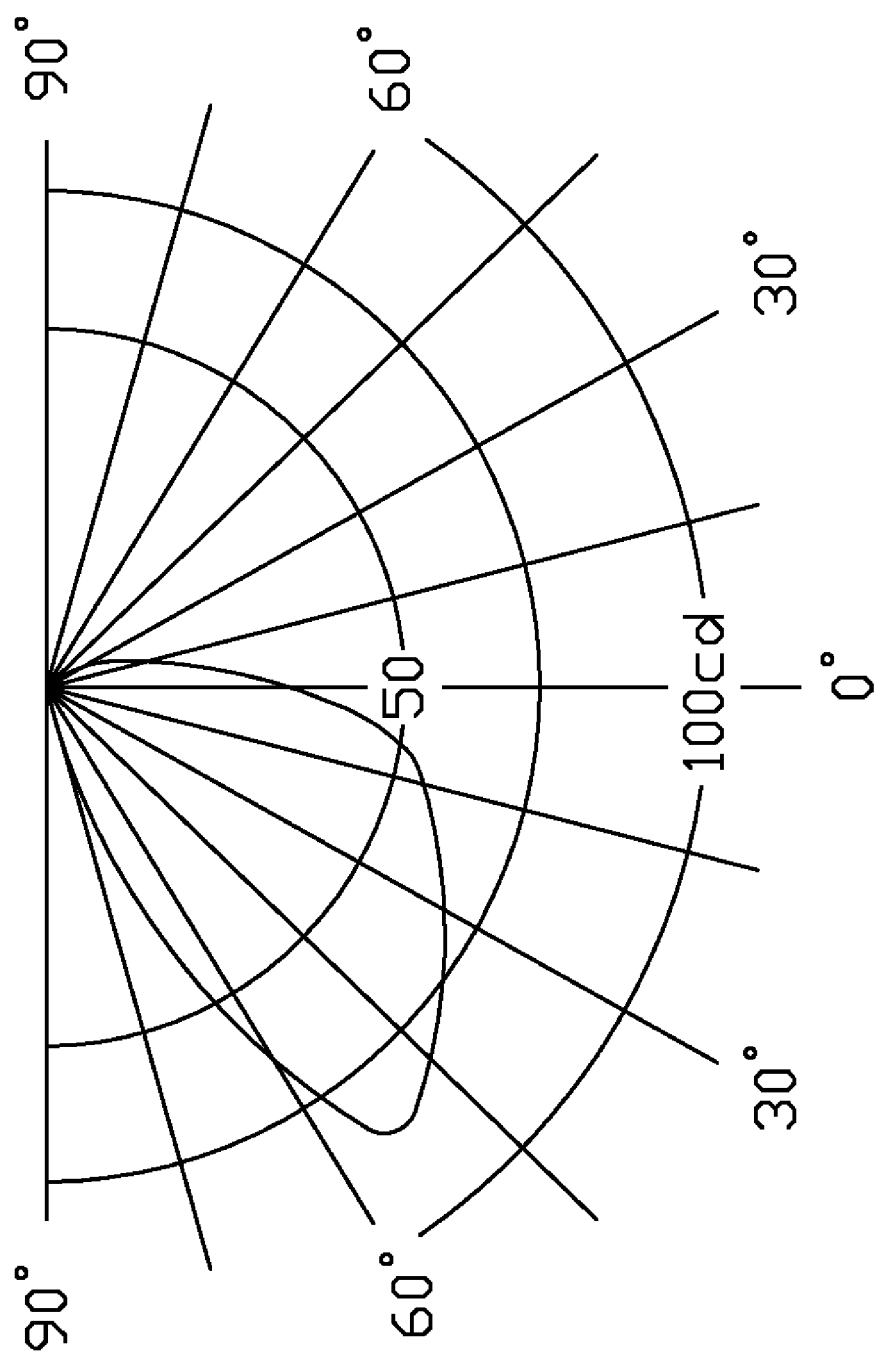
FIG. 8 is an illumination distribution pattern map of light reflected by first reflective plates of the illumination device in FIG. 7.
Figure 9:
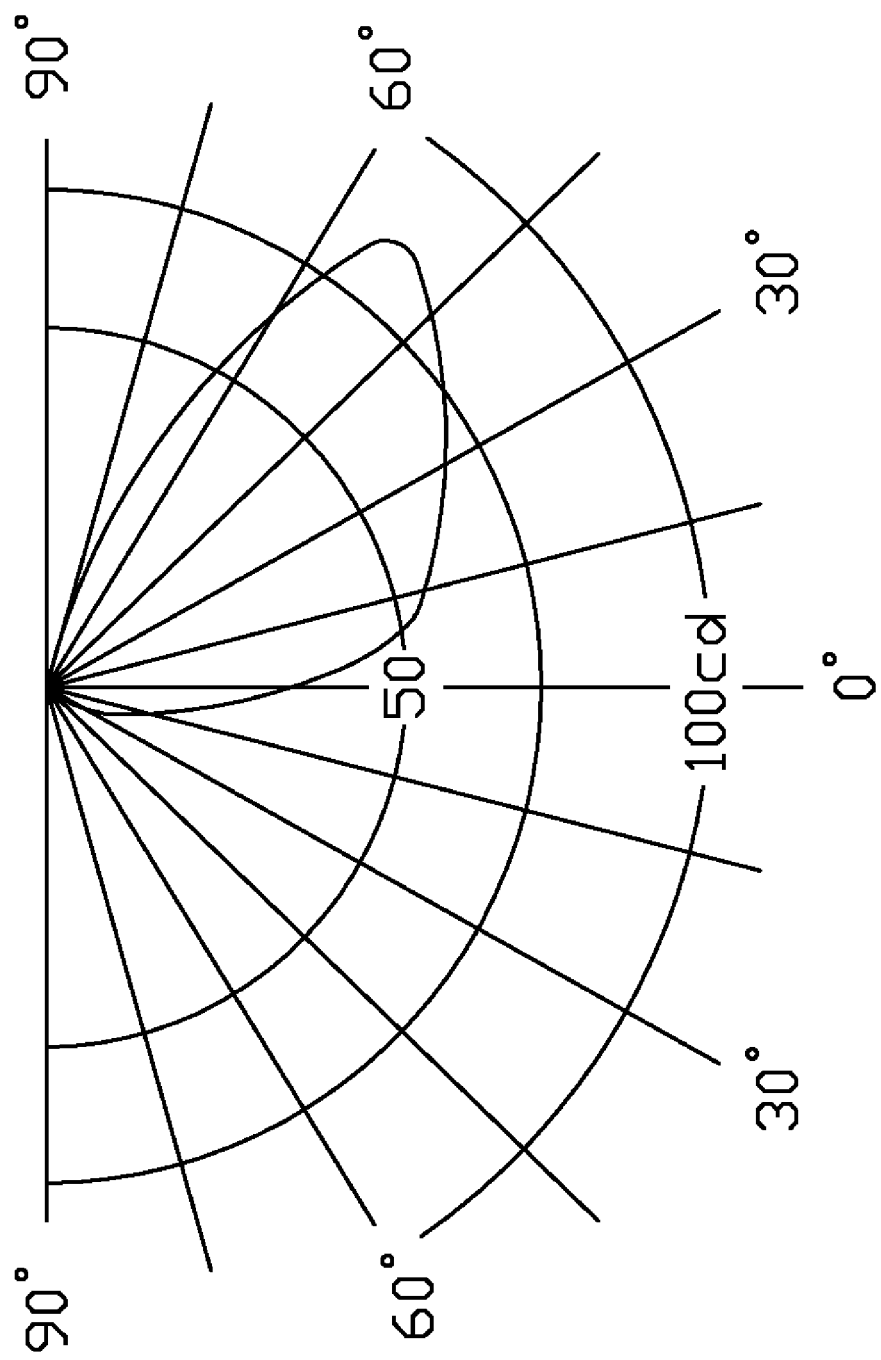
FIG. 9 is an illumination distribution pattern map of light reflected by second reflective plates of the illumination device in FIG. 7.
Figure 10:
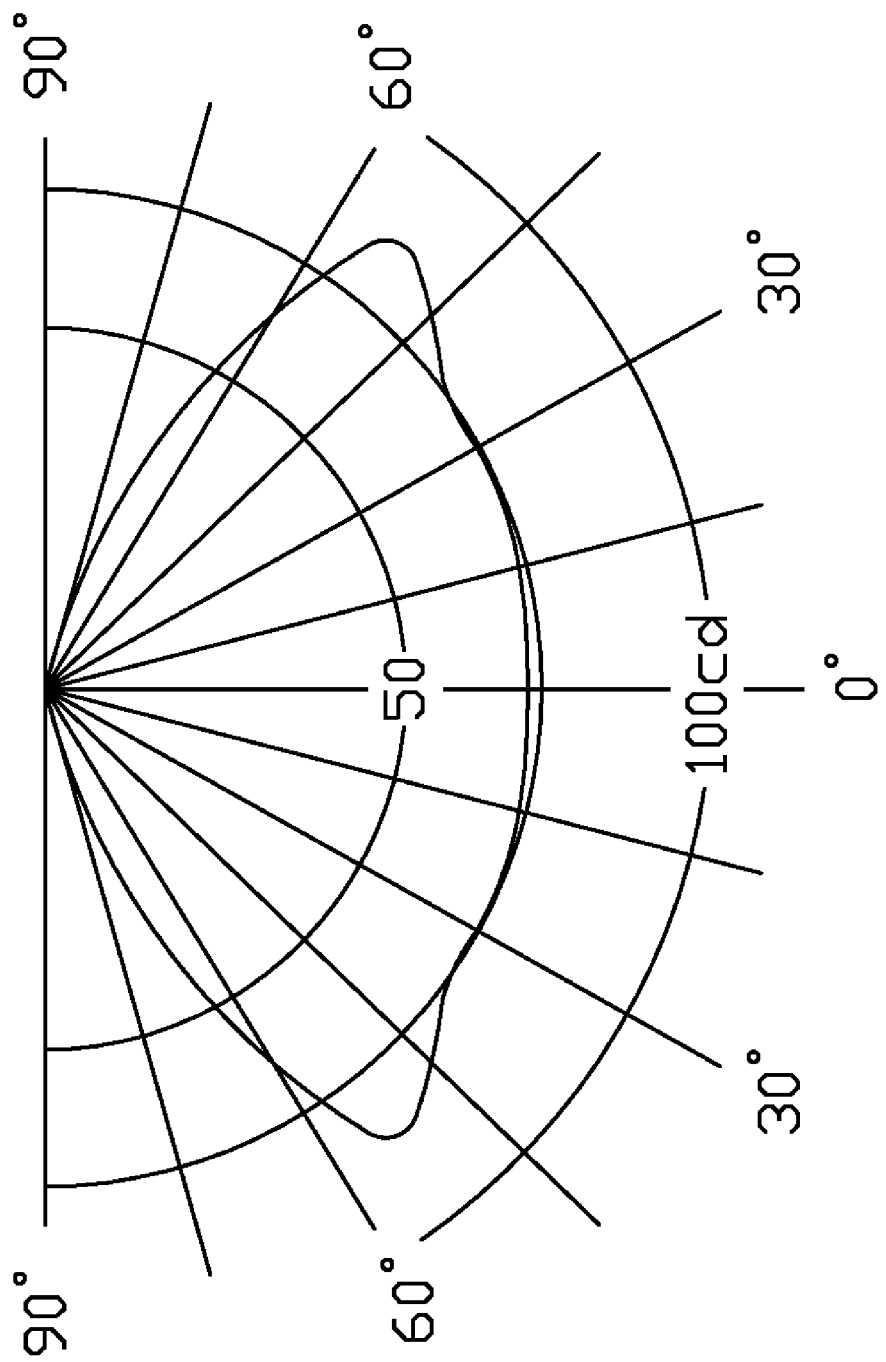
FIG. 10 is an illumination distribution pattern map of light reflected by first reflective plates and second reflective plates of the illumination device in FIG. 7.

FIG. 8 is an illumination distribution pattern map of light reflected by first reflective plates 3141. FIG. 9 is an illumination distribution pattern map of light reflected by second reflective plates 3142. FIG. 10 is a superposition of the illumination distribution patterns generated by light reflected by first reflective plates 3141 and second reflective plates 3142.

Figure 11A:
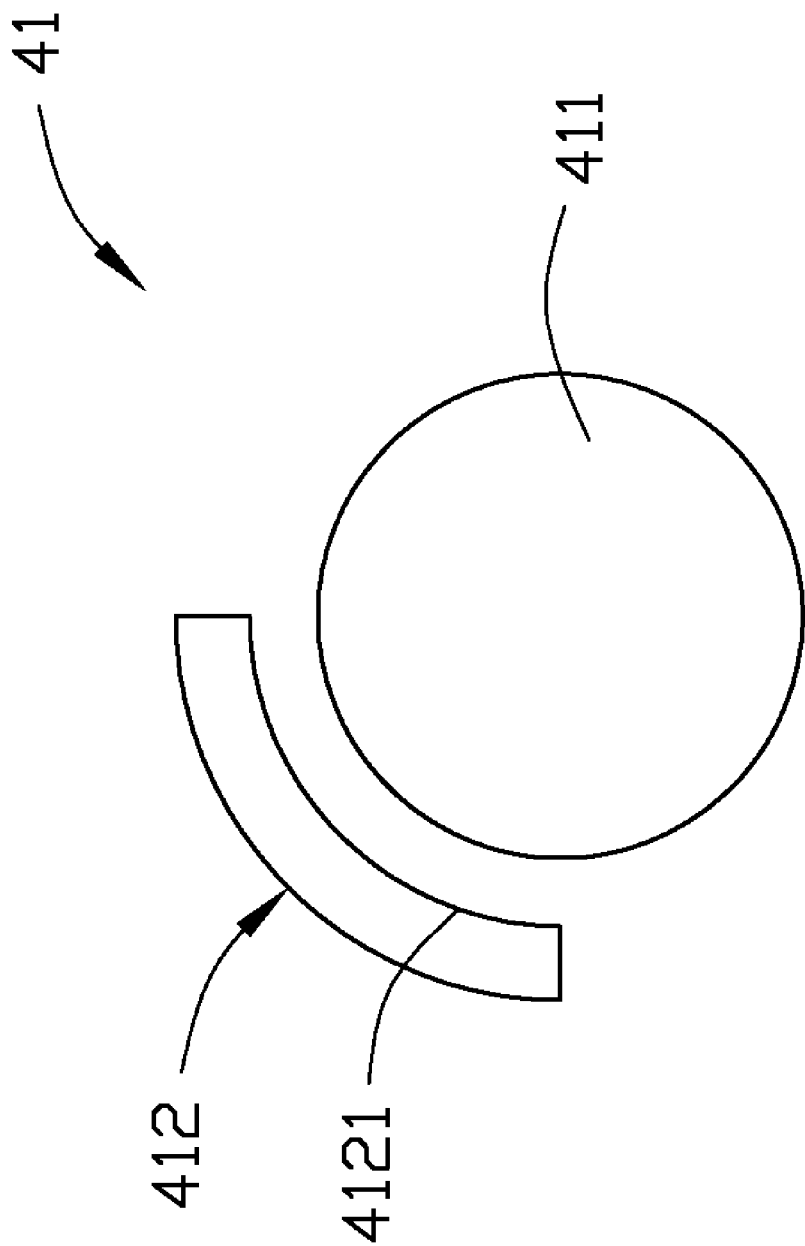
FIGS. 11A-11E are top views of multiple reflecting plates that can be utilized in the illumination device in FIG. 7.

Referring to FIG. 11A, a light source 41 includes a light emitting element 411 and a reflective plate 412. An inner surface 4121 of the reflective plate 412 is concave. A cross section of the reflective plate 412 is a quarter circle. The reflective plate 412 is defined around the light emitting element 411. Because a part of light from the light emitting element 411 is reflected by the reflective plate 412, the illumination distribution pattern of the light source 41 with the reflective plate 412 is asymmetrical.

Figure 11B:
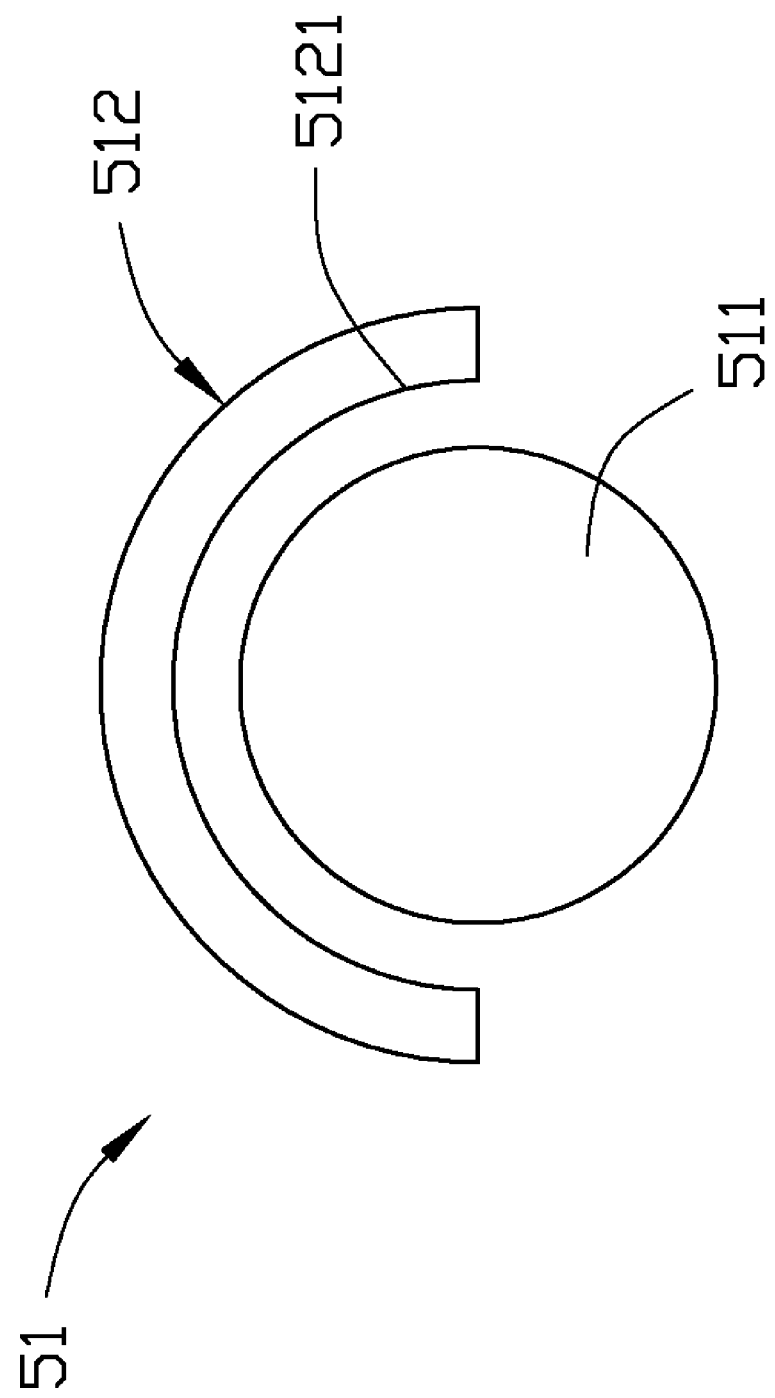

Referring to FIG. 11B, a light source 51 is similar to the light source 41 in FIG. 11A, differing only in that a cross section of a reflective plate 512 is semicircular.

Figure 11C:
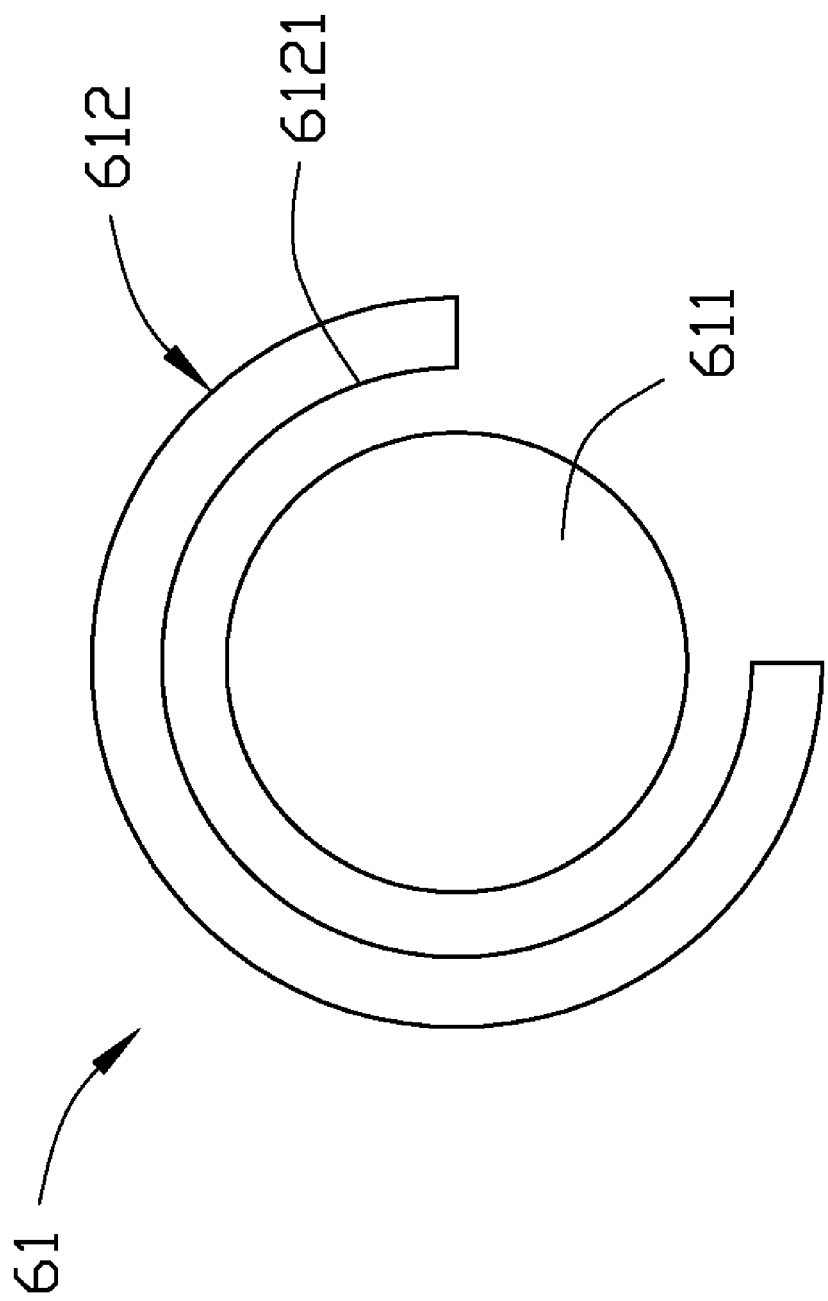

Referring to FIG. 11C, a light source 61 is similar to the light source 41 in FIG. 11A, differing only in that a cross section of a reflective plate 612 is a three-quarter circle.

The cross-sections of the reflective plates 412, 512, 612 can be elliptical, there being no limitation of shape as disclosed.

Figure 11D:
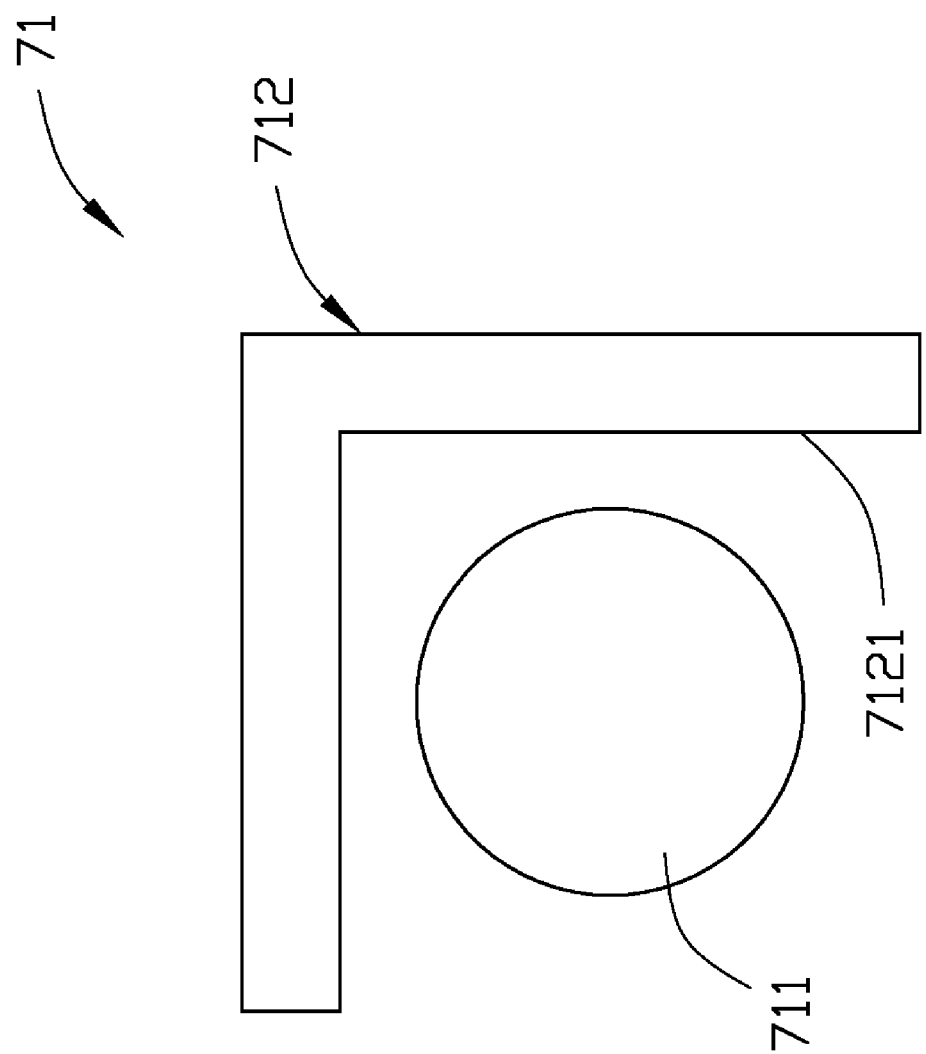
Figure 11E:
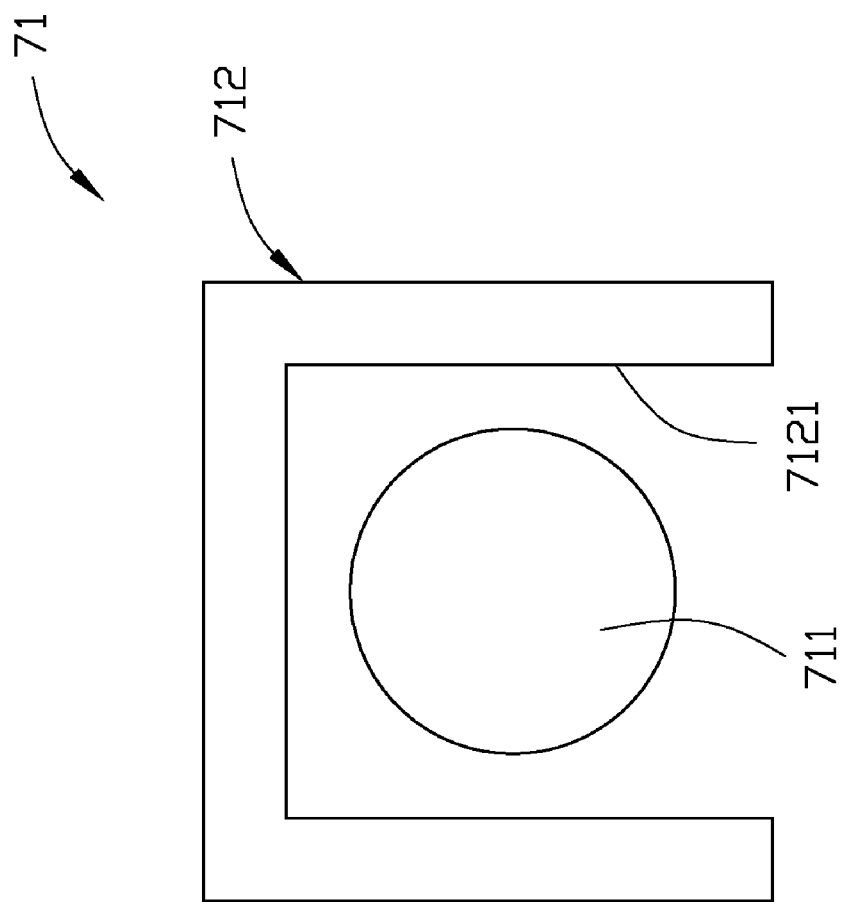

Referring to FIG. 11D and FIG. 11E, a light source 71 is similar to the light source 41, differing only in that a cross section of a reflective plate 712 is a partial square, such that the illumination distribution pattern of the light source 71 is asymmetrical. The reflective plate 712 is L-shaped in FIG. 11D and the reflective plate 712 is U-shaped in FIG. 11E.

Figure 12:
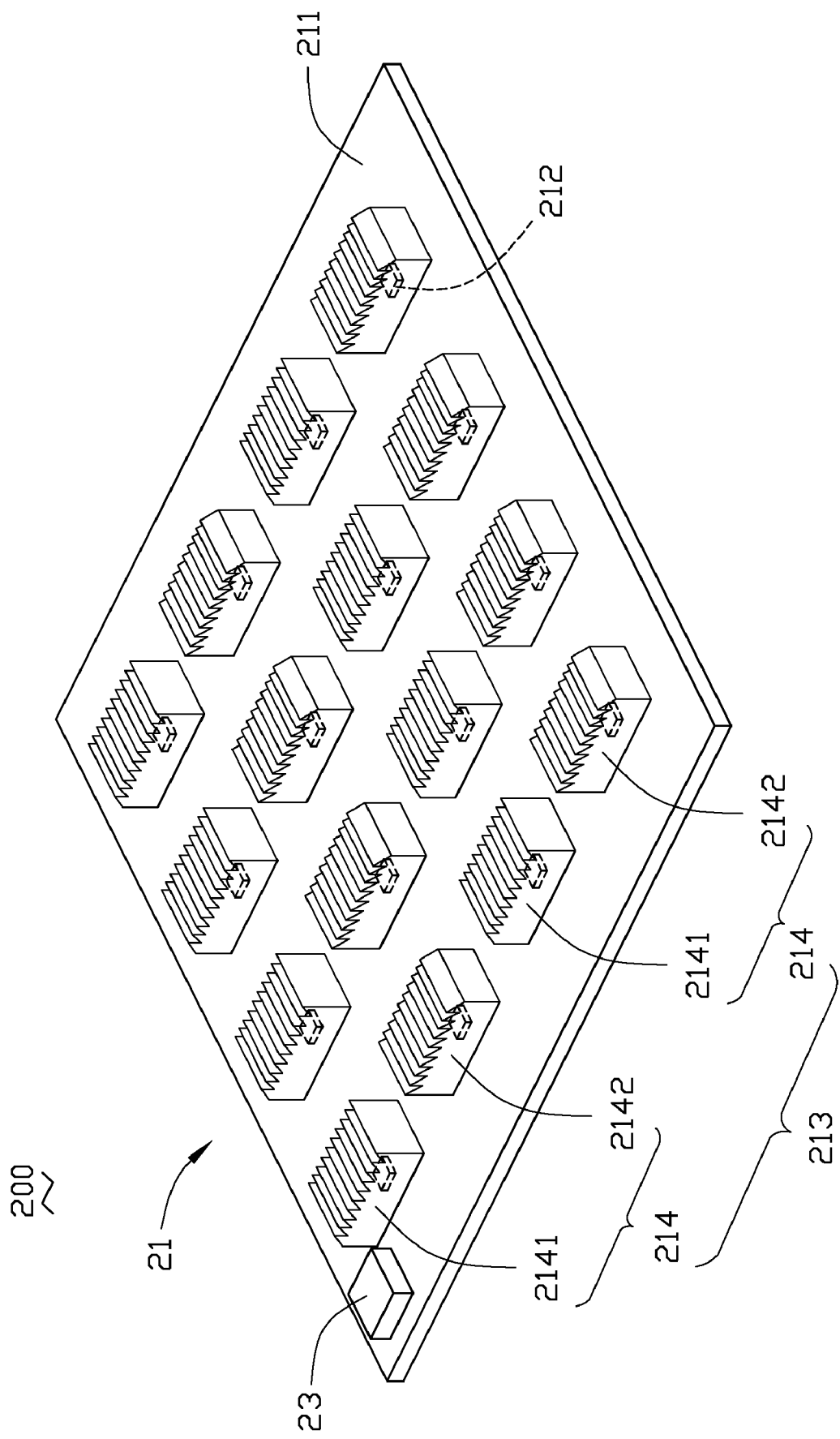
FIG. 12 is an isometric view of an illumination device in accordance with a third embodiment of the disclosure.
Figure 13:
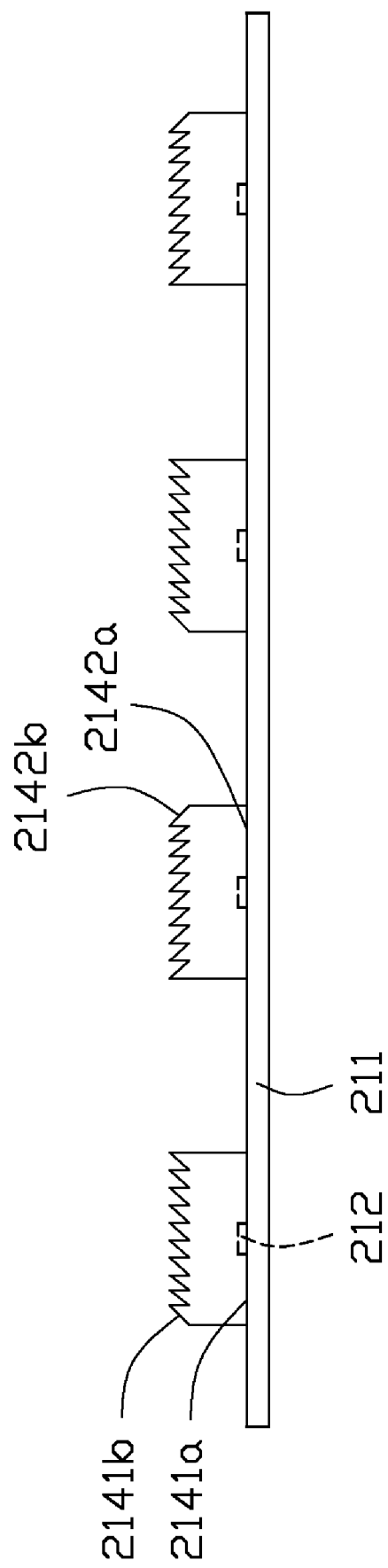
FIG. 13 is a cross-section of the illumination device in FIG. 12.
Figure 14:
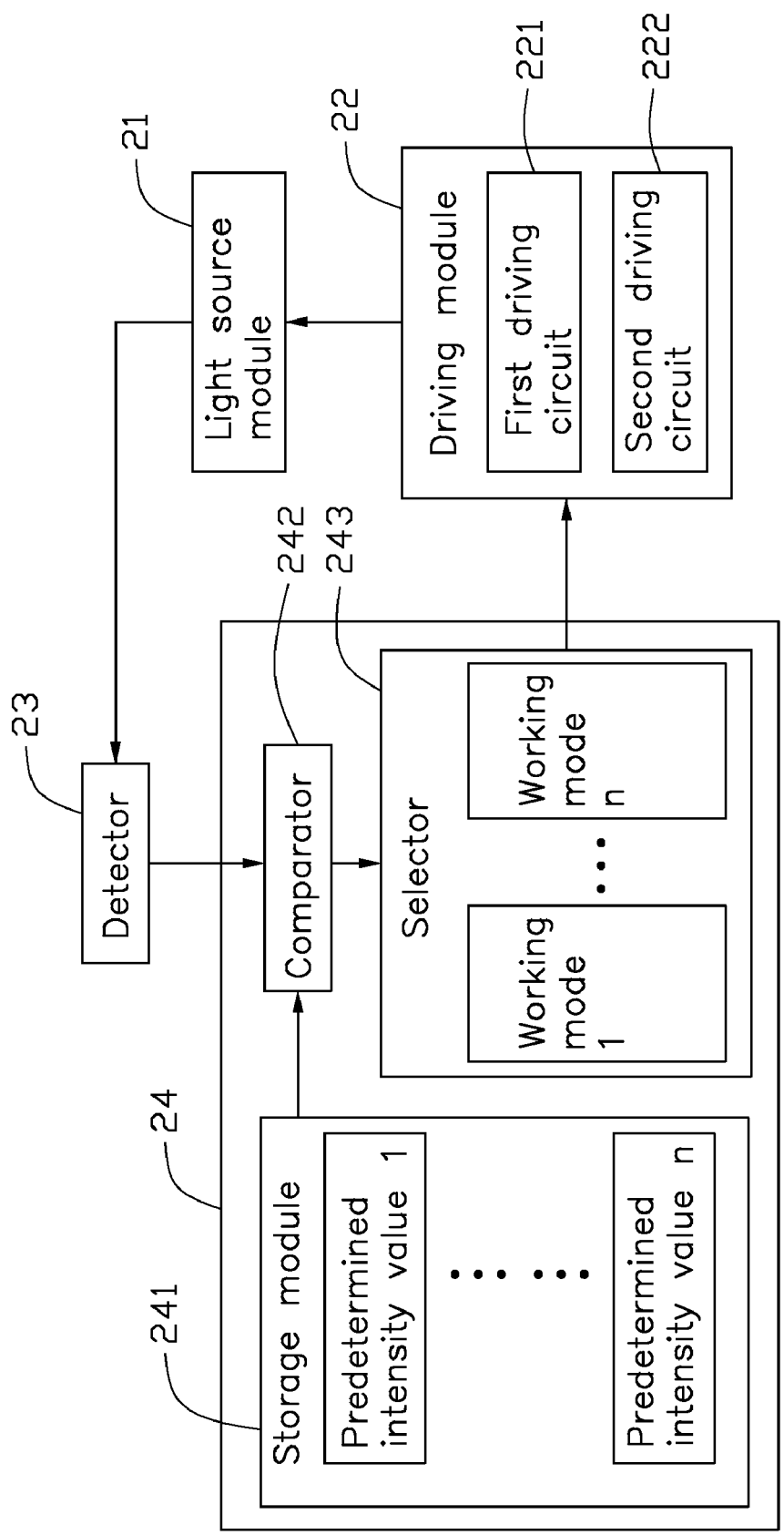
FIG. 14 is a block diagram of the illumination device in FIG. 12.

Referring to FIGS. 12-14, an illumination device 200 in accordance with a third embodiment of the disclosure includes a light source module 21, a driving module 22, a detector 23 and a processor 24.

The light source module 21 includes a substrate 211, a plurality of light emitting elements 212, and an optical module array 213.

The light emitting elements 212 are arrayed on the substrate 211 and electrically connected thereto. The light emitting elements 212 are light emitting diodes. The optical module array 213 is a lens array. The optical module array 213 includes a plurality of lens modules 214. Each of lens modules 214 includes a first lens 2141 and a second lens 2142.

The first lens 2141 includes a first surface 2141a and a second surface 2141b. The first surface 2141a is a light incident surface. A plurality of saw-toothed protrusions is defined on the second surface 2142b.

The second lens 2142 includes a first surface 2142a and a second surface 2142b. The first surface 2142a is a light incident surface. A plurality of saw-toothed protrusions is defined on the second surface 2142b. The saw-toothed protrusions of the second surface 2141b and the saw-toothed protrusions of the second surface are arranged symmetrically. Each protrusion on one of the second surfaces 2141b, 2142b has a vertical plane (not labeled) and an inclined plane (not labeled). The inclined planes on the second surfaces 2141b extend upwardly along a rightward direction of FIG. 13, while the inclined planes on the second surfaces 2142b extend downwardly along the rightward direction.

The light emitting elements 212 are arranged on the substrate 211 in an array consisting of m rows and n columns. The m and n are integers. The first lens 2141 and the second lens 2142 are arranged interleavedly on the substrate 211.

The detector 23 is a light intensity detector. The detector 23 is arranged on the substrate 211 and configured for detecting the intensity of environmental illumination.

The driving module 22 includes a first driving circuit 221 and a second driving circuit 222. The first driving circuit 221 is configured for controlling current through the light emitting elements 212 corresponding to the first lens 2141 and intensity thereof. The second driving circuit 222 is configured for controlling current through the light emitting elements 212 corresponding to the second lens 2142 and intensity thereof.

The processor 24 is electrically connected to the detector 23 and the driving module 22. The processor 24 includes a storage module 241, a comparator 242 and a selector 243.

The storage module 241 is configured for storing a plurality of predetermined intensity values of environmental illumination. The selector 243 includes a plurality of working modes. The total number of the predetermined intensity values of environmental illumination is equal to the total number of the working modes in the selector 243.

The comparator 242 is configured for receiving an intensity signal of environmental illumination from the detector 23. The comparator 242 is configured for comparing a predetermined intensity value in the storage module 241 and the intensity signal of environmental illumination from the detector 23. Thus, the comparator 242 provides a selected intensity value to the selector 243. According to the selected intensity value, a selected working mode is selected by the selector 243. The selector 243 provides a working mode signal corresponding to the selected working mode to the driving module 22. The first driving circuit 221 and the second driving circuit 222 control currents through the light emitting elements 212 according to the working mode signal from the selector 243. Thus, the first illumination distribution pattern and the second illumination distribution pattern are generated.

The illumination distribution pattern of the illumination device 200 is superposition of the first illumination distribution pattern and the second illumination distribution pattern.

Thus, the illumination device 200 can provide multiple illumination distribution patterns according to the specific requests.

Figure 15:
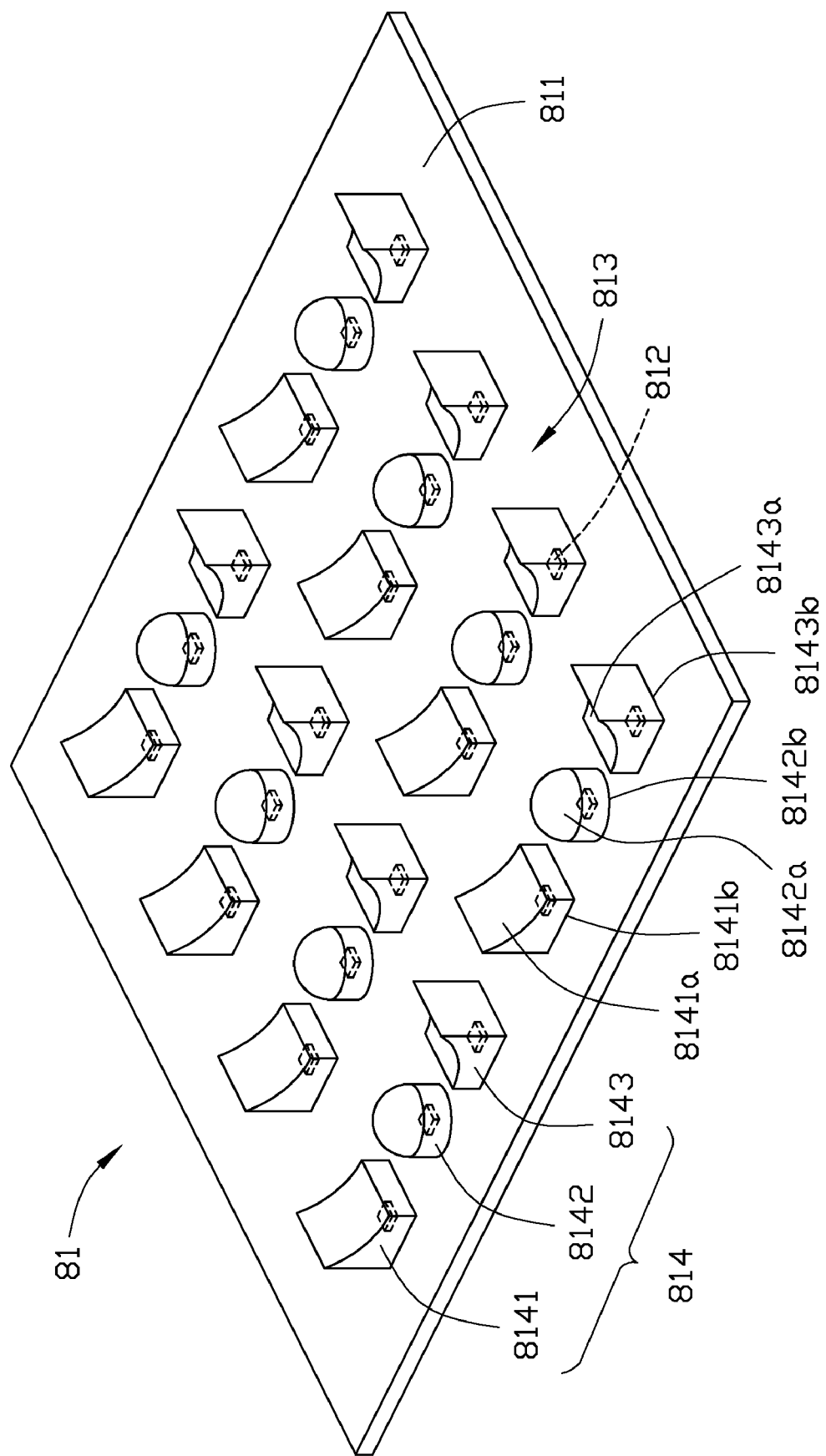
FIG. 15 is an isometric view of a second light source module utilized in the illumination device in FIG. 12.

Referring to FIG. 15, a light source module 81 is similar to the light source module 21, differing only in that the lens module 814 includes a first lens 8141, a second lens 8142 and a third lens 8143.

When the light from the light emitting elements 812 passes through the first lens 8141, a first illumination distribution pattern is generated. When light from the light emitting elements 812 passes through the second lenses 8142, a second illumination distribution pattern is generated. When light from the light emitting elements 812 passes through the first lenses 8143, a third illumination distribution pattern is generated. The first lens 814 has a light incident surface 8141b and a concave light emitting surface 8141a. The second lens 8142 has a light incident surface 8142b and a convex light emitting surface 8142a. The third lens 8143 has a light incident surface 8143b and a concave light emitting surface 8143a. The second lens 8142 is located between the first and third lenses 8141, 8143. The concave light emitting surfaces 8141a, 8143a are symmetrical to each other and descend toward each other.

Accordingly, the illumination device 200 can provide multiple illumination distribution patterns by superposition of the first illumination distribution pattern, the second illumination distribution pattern and the third illumination distribution pattern.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An illumination device comprising:
a light source module comprising a substrate and a plurality of light emitting elements; and
an optical module array mounted on the substrate, the light emitting elements electrically connected to the substrate and mounted thereon in array, the optical module array comprising a plurality of optical modules, each comprising a first optical component covering a corresponding light emitting element and a second optical component covering another corresponding light emitting element, a first illumination distribution pattern generated by light from the light emitting elements and modulated by the first optical components of the optical modules, a second illumination distribution pattern generated by light from the light emitting elements and modulated by the second optical components of the optical modules, an illumination distribution pattern of the illumination device being a superposition of the first illumination distribution pattern and the second illumination distribution pattern.

2. The illumination as claimed in claim 1, wherein the first optical component is a first lens and the second optical component is a second lens, the first lens comprising a first surface and a second surface, the first surface of the first lens being a light incident surface, the second lens comprising a first surface and a second surface, the first surface of the second lens being a light incident surface, the second surface of the first lens and the second surface of the second lens arranged symmetrically, the second surfaces being light emitting surfaces of the first and second lenses.

3. The illumination device as claimed in claim 1 further comprising a detector, the detector configured for detecting an intensity of environmental illumination.

4. The illumination device as claimed in claim 3 further comprising a driving module, the driving module receiving a signal from the detector, the driving module comprising a first driving circuit and a second driving circuit, the first driving circuit and the second circuit respectively controlling the current through the light emitting elements corresponding to the first optical components and the light emitting elements corresponding to the second optical components.

5. The illumination device as claimed in claim 1, wherein the first optical component is a first reflective plate and the second optical component is a second reflective plate, an inner surface of the first reflective plate and an inner surface of the second reflective plate configured for reflecting the light from the light emitting elements, the first reflective plate and the second reflective plate arranged symmetrically.

6. The illumination device as claimed in claim 5, wherein respective cross sections of the first optical components and the second optical components are partial circles.

7. The illumination device as claimed in claim 5, wherein respective cross sections of the first optical component and the second optical component are partially foursquare.

8. The illumination device as claimed in claim 1, wherein the first optical component is a first lens and the second optical component is a second lens, the first lens comprising a first surface and a second surface, the first surface of the first lens being a light incident surface, a plurality of saw-toothed protrusions defined on the second surface of the first lens, the second lens comprising a first surface and a second surface, the first surface of the second lens being a light incident surface, a plurality of saw-toothed protrusions defined on the second surface of the second lens, the saw-toothed protrusions of the first lens and the saw-toothed protrusions of the second lens arranged symmetrically, the second surfaces being light emitting surfaces of the first and second lenses.

9. The illumination device as claimed in claim 2, wherein each of the optical modules further comprises a third optical component, the third optical component being a third lens located between the first and second lens, the third lens comprising a first surface and a second surface, the first surface of the third lens being a light incident surface, the second surface of the third lens being convex and a light emitting surface.

10. The illumination device as claimed in claim 4 further comprising a processor, the processor configured for storing a plurality of working modes and receiving an intensity signal of environmental illumination from the detector, the processor selecting a selected working mode and providing the selected working mode to the driving module, the first driving circuit and the second driving circuit of the driving module controlling currents through the light emitting elements according to the selected working mode.

11. The illumination device as claimed in claim 10, wherein the processor comprises a storage module, a comparator and a selector, the storage module configured for storing a plurality of predetermined intensity values of environmental illumination, the selector comprising a plurality of working modes, the comparator comparing the predetermined intensity values in the storage module and the intensity signal from the detector, the comparator providing a comparison signal to the selector, a selected working mode selected by the selector according to the comparison signal, the selector providing a working mode signal corresponding to the selected working mode to the driving module, the driving module controlling the currents through the light emitting elements according to the working mode signal from the selector.

* * * * *